United States Patent [19]

Forrat

[11] 4,171,003
[45] Oct. 16, 1979

[54] SOLAR ENERGY TO ELECTRICAL ENERGY CONVERTER

[75] Inventor: Francis Forrat, Grenoble, France

[73] Assignee: Commissariat a l'Energie Atomique, Paris, France

[21] Appl. No.: 893,395

[22] Filed: Apr. 4, 1978

[30] Foreign Application Priority Data

Apr. 5, 1977 [FR] France .................................. 77 10279

[51] Int. Cl.² ............................................ H01L 31/06
[52] U.S. Cl. ............................ 136/89 PC; 136/89 HY; 126/438
[58] Field of Search ............ 136/89 PC, 89 HY, 89 P, 136/89 SJ; 126/270, 271

[56] References Cited

U.S. PATENT DOCUMENTS

| 3,591,420 | 7/1971 | Streed | 136/89 |
| 3,990,914 | 11/1976 | Weinstein et al. | 136/89 |

FOREIGN PATENT DOCUMENTS 2501907 7/1976 Fed. Rep. of Germany ...... 136/89 PC

OTHER PUBLICATIONS

B. L. Sater et al., "The High Intensity Solar Cell–Key to Low Cost Photovoltaic Power," *Conf. Record, 11th IEEE Photovoltaic Specialists Conf.* (1975), pp. 356-363.

*Primary Examiner*—Aaron Weisstuch
*Attorney, Agent, or Firm*—Thomas J. Greer, Jr.

[57] ABSTRACT

Solar radiation is collected and directed through transparent material for the optical conversion of solar radiation to infrared radiation onto a rod-shaped multijunction semi-conductor photovoltaic cell. This is achieved by means of a focusing structure of linear form having a focal line and a plate of transparent converting material. The plate is placed in the vicinity of the focal line and performs the double function of light guide and optical converter. The semiconductor rod is placed along one of the longitudinal edges of the plate.

4 Claims, 6 Drawing Figures

SOLAR ENERGY TO ELECTRICAL ENERGY CONVERTER

This invention relates to a converter for converting solar energy to electrical energy.

It is known that a solar energy to electrical energy converter usually consists in a general manner of means for collecting solar radiation and directing it to a photovoltaic cell which effects the desired conversion. The photovoltaic cells employed can have various shapes and structures. The most advantageous designs include semiconductor cells, more especially those constituted by filamentary multijunction diodes which are illuminated in a direction parallel to the plane of the junctions. In this application, the advantage of these diodes is related to their low series resistance which endows them with good conversion efficiency.

However, the use of these photovoltaic cells encounter a difficultry which arises from the fact that the greater part of solar radiation (namely the radiation which lies in the visible region of the spectrum) is absorbed in the vicinity of the surface of the semiconductor; it is precisely at this point that parasitic surface phenomena play a part in limiting the conversion efficiency. At a depth below the surface, the efficiency would be higher but the light intensity at this depth is of lower value, with the result that the voltage produced by deep layers remains low and decreases as the distance from the surface increases. Furthermore, a "curve factor", the origin and function of which will be more clearly understood hereinafter, produces a further reduction in overall conversion efficiency.

If the visible portion of the spectrum of collected solar radiation is converted to radiation which lies in the near infrared (from $0.8/0.9\mu$ to $1.1/1.2\mu$ approximately) and if the multijunction diode is illuminated with said infrared radiation, higher overall conversion efficiency is obtained even if frequency-conversion losses are taken into account. This can be explained by the fact that the infrared radiation penetrates into the semiconductor to a greater extent, which has the effect on the one hand of increasing the contribution of the inner layers of the diode, the performances of which are little or not affected by surface phenomena and, on the other hand, of giving the current-voltage characteristic of the diode a practically rectangular shape. The tendency of both these modifications is to achieve enhanced conversion efficiency.

The solar energy converter in accordance with the present invention accordingly makes use of an optical frequency converter constituting means for modifying the frequency of an optical radiation. In more exact terms, the converter employed in the invention is capable of converting the incident visible radiation to radiation which has a longer wavelength.

A converter of this type is already employed in certain solar converters which make use of a photovoltaic cell consisting of a flat junction diode which is illuminated at right angles to the plane of the junction. But the operation of a diode of this type when illuminated under such conditions differs from that of a filamentary diode, especially in that the junction is uniformly illuminated and located at a constant depth, thus reducing the influence of parasitic surface phenomena. However, this presupposes that the junction has a relatively substantial depth (considerably greater than $100\mu$) and that the charges created relatively near the surface are not collected. Relevant information on this subject can be obtained from the article published by W. H. Weber and J. Lambe in the "Applied Optics" review of October 1976, volume 15, No. 10, page 2299 and entitled "Luminescent greenhouse collector for solar radiation," which article is incorporated herein by reference.

In the prior art, frequency converters and systems for collection of solar radiation have distinct characters and their functions are appreciably dissociated. The aim of the present invention is to combine these means and functions in order to increase the conversion efficiency of the unit as a whole. To this end, the photovoltaic cell employed has the shape of a rod and is associated with a focusing and converting structure which is adapted to this shape or in other words which is of linear form.

In more precise terms, this invention is therefore directed to a solar energy to electrical energy converter of the type comprising means for collecting solar radiation and directing the radiation through a transparent material for optical conversion of solar radiation to infrared radiation and then onto a photovoltaic cell constituted by a semiconductor rod. The invention is characterized in that the aforesaid means are constituted by a focusing structure of linear form having a focal line and by a plate of said transparent converting material, said plate being placed in the vicinity of the focal line and intended to perform the double function of light guide and optical converter, the semiconductor rod being placed along one of the longitudinal edges of said plate.

The optical frequency converter can make use of one of the numerous materials which have a known capacity for absorbing visible light and re-emitting said light in the near infrared in the vicinity of $1\mu$, usually by a fluorescence mechanism. The material can consist of mineral ions or organic molecules dissolved in a matrix which can be a solid such as glass, for example, or a mineral or organic liquid. By way of example, it is possible to employ a glass doped rare-earth ions such as $Nd^{3+}$ or $Yb^3$ ions. It is also possible to employ substances which absorb visible radiation and transfer their excitation energy to other substances which are de-excited and re-emit radiation in the infrared region.

In addition to the main advantage which arises from the enhanced conversion efficiency achieved by the optical converter in the semiconductor rod, the use of the converter offers a further advantage in that it permits recovery of that part of the solar energy which is dissipated in the form of heat within the converting material, this being carried out without any need to produce action at the level of the diode. The function of conversion to electrical energy performed by the device in accordance with the invention may therefore be duplicated if necessary by a function of conversion of thermal energy, these two functions being performed by distinct and independent means.

The heat dissipated in the optical converter can be removed either by means of the converting material itself if the latter is suited to the purpose or by means of a heat-transporting auxiliary fluid. A flow rate of the order of 1 liter/min. per square meter of focusing mirror usually results in a temperature rise of the order of 20° C. The heat delivered by this part of the converter is at a temperature of approximately 60°-80° C.

When a filamentary multijunction diode is employed, said diode can be constituted in known manner by a wire of any desired cross-sectional shape, especially a circular shape, having a length of the order of one meter, for example, a diameter of a few millimeters such as 4 mm, for example, and formed of material consisting preferably of silicon having a resistivity within the range of approximately 0.1 to 10 Ωcm. The diode is constituted by an alternate arrangement of p-type and n-type doped regions with a period of 250μ, for example. A diode of this type can be obtained by brazing a stack of conventional p+, p, n diodes which are metallized on one of their two faces with nickel and tin. The diode makes it possible to deliver a high voltage of 220 V, for example.

The means for collecting solar radiation and directing said radiation onto the optical converter can be of any known type (of the cylindrical type or lens type). Said means can be coupled with movable means for varying the elevation and/or in azimuth.

The distinctive features and advantages of the present invention will in any case become more readily apparent from the following description of exemplified embodiments which are given by way of explanation and not in any limiting sense, reference being made to the accompanying drawings, wherein.

Figure 1:
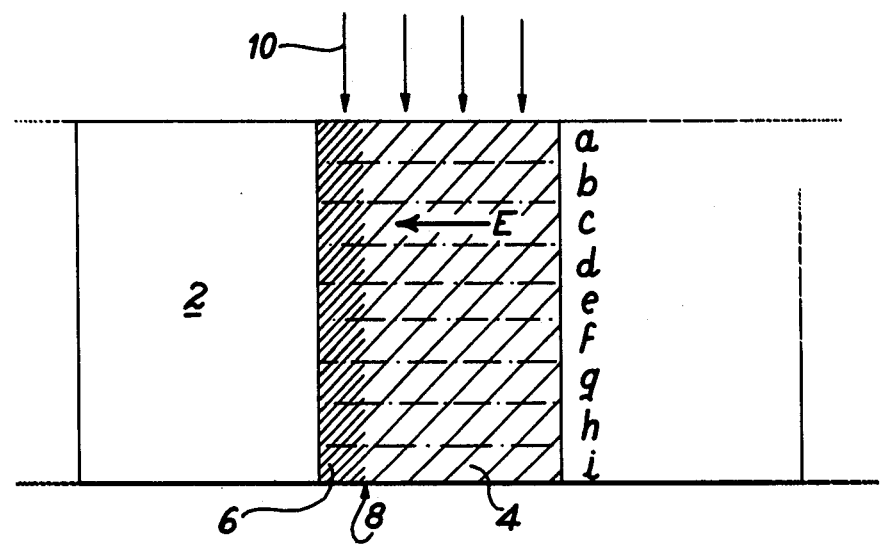
FIG. 1 is a longitudinal sectional view of the multijunction diode and serves to illustrate the difference in behavior between the surface zones and the deep zones.
Figure 2:
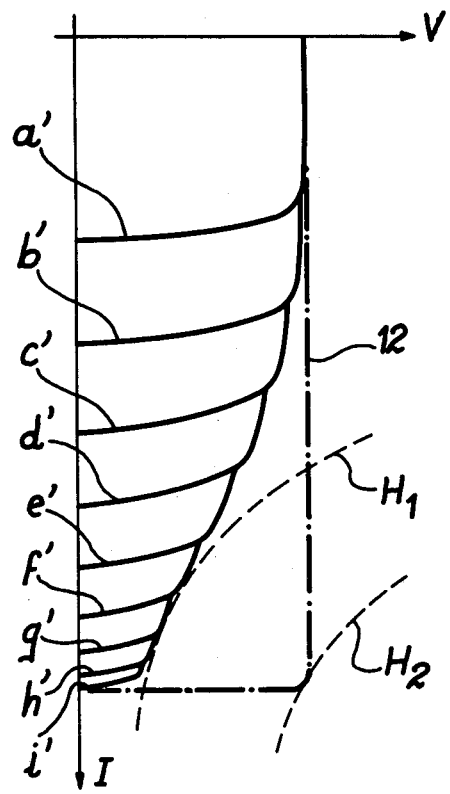
FIG. 2 shows the current-voltage characteristic of the diode of FIG. 1.

It is of interest to recall the origin of increased conversion efficiency of semiconductor-type photovoltaic cells as achieved by use of wavelength conversion material, reference being accordingly made to FIGS. 1 and 2.

FIG. 1 is a longitudinal sectional view in which a multijunction diode is illustrated diagrammatically without conforming to dimensional orders of magnitude.

In this figure, the multijunction rod is designated by the reference numeral 2 and constituted by an alternate arrangement of p-type and n-type doped semiconducting regions 4 and 6 respectively which define junctions 8. Each junction is illuminated to a direction substantially parallel to its plane by incident radiation 10 and subjected to an electric field E, said field being directed from the p-type doped region to the n-type doped region. This structure is repeated periodically, only one diode being shown in FIG. 1.

A rod of this type can have a cross-section of any desired shape. For the sake of simplicity, it will be assumed that this shape is rectangular.

The operation of a diode of this type can be more readily understood if it is considered by way of example that it is formed by a parallel array of separate diodes having the same thickness. In FIG. 1, these diodes are defined by rectangles designated respectively by the references a, b, etc ... h, i. In the case of each separate diode, the number of charges collected by the electric field E established in the junction depends on the intensity of the light which shines on the junction.

Said light intensity depends on the distance Y from the junction to the surface (which fixes the absorption $e^{-\alpha y}$ experienced by the radiation if $\alpha$ designates the absorption coefficient for a given wavelength) and on the spectral distribution of the incident radiation 10. It is in fact known that the solar spectrum exhibits a maximum value in the vicinity of the yellow portion of the visible spectrum with a minimum in the vicinity of 0.3μ and spreads out in the near infrared region. It is also known that the absorption of silicon is not the same in the visible region as in the near infrared, with the result that the different layers of the diode receive radiations which differ both in intensity and in wavelength.

This non-uniformity of illumination of the junction is clearly shown in the experimental results recorded in the following table which indicates in the case of silicon the approximate depth of penetration P of a radiation as a function of its wavelength λ expressed in microns.

| λ | P |
|---|---|
| 0.4 | 0.5μ |
| 0.5 | 5μ |
| 0.6 | 10μ |
| 0.7 | 20μ |
| 0.8 | 50μ |
| 0.9 | 170μ |
| 1 | 500μ |
| 1.06 | 2.5 mm |
| 1.1 | 5 mm |

From this table it is apparent for example that, in the blue end of the spectrum at about $\lambda = 0.5\mu$, the radiation is absorbed at 5 microns whereas at $\lambda = 1.06\mu$ (the wavelength which corresponds to the radiation emitted by $Nd^{3+}$ ions), the radiation can reach depths of approximately 2.5 mm.

These results bring out the fact that a diode illuminated in a direction parallel to the plane of the junction by a radiation having the spectral distribution of solar light is not illuminated in a uniform manner since that portion of radiation which is located in the infrared is capable of reaching the junction at depths of the order of a few millimeters whereas the blue portion is totally attenuated in a few microns.

In consequence of the foregoing, the beneficial role performed by the optical frequency converter will be readily understood.

In fact, if said converter is capable of absorbing visible radiation and of re-emitting radiation located in the near infrared, for example in the vicinity of 1 micron, said infrared radiation will be able to penetrate into the diode to a depth of a few millimeters. This will accordingly give rise to considerably greater homogeneity of illumination and will constitute a first factor of improvement of efficiency. Moreover, a second factor which is conductive to the same result arises from the modification of the shape of the current-voltage characteristic of the diode as will now be explained with reference to FIG. 2.

This figure shows a series of curves drawn in a system of axes on which are plotted the current I (expressed in mA) and the voltage V (expressed in mV) in the case of a diode of the type shown in FIG. 1. If it is considered that this diode is formed by the parallel connection of elementary junctions a, b, c etc ... h, i having the same size but different depths, the general characteristic I (V)

can be plotted by constructing this curve in successive segments as a function of each elementary diode. This is shown in FIG. 2, in which the elementary characteristics are designated by the letter references a', b', c', ... h', i' corresponding to the associated elementary diodes of FIG. 1.

The elementary diodes produce decreasing voltages when they are located at greater distances from the surface by reason of surface phenomena which exert a strong influence in limiting their efficiency. In consequence, the curve resulting from the parallel connection of all these elementary diodes does not have the rectangular shape which it would have if each elementary diode aforesaid were equally illuminated. This ideal rectangular curve is designated in FIG. 2 by reference numeral 12.

The efficiency of a diode is directly related to the product of the voltage V and of the current I. The result thereby achieved is that, in a diagram of the type given in FIG. 2, the curves of equal efficiency are hyperbolas in which the axes are the asymptotes. The maximum efficiency which can be attained with a diode constituted by the parallel connection of elementary diodes of FIG. 1 illuminated by solar light corresponds to the hyperbola $H_1$ which is tangent to the characteristic. This efficiency is clearly lower than the efficiency corresponding to the hyperbola $H_2$ which is tangent to the characteristic 12 obtained with a uniformly illuminated junction.

Thus FIG. 2 shows that preliminary conversion of incident visible radiation to infrared radiation makes it possible to improve the uniformity of illumination of the junctions and consequently to give the characteristic a shape which approximates the ideal rectangular shape is likely to improve the conversion efficiency by virtue of the "fill factor".

Furthermore, the present Applicant has discovered that, in multijuctions which are parallel to the light rays, the charges created within the semiconductor are collected irrespective of the distance between the junctions and the external surface provided that the thickness of each p-type region or n-type region is smaller than the diffusion length, namely approximately $125\mu$, whereas in junctions which are perpendicular to the light rays, only the charges created within a silicon segment centered on the junction and having a thickness of $250\mu$ are collected. This phenomenon had not been observed in the prior art.

Having now explained these interpretations of the increase in conversion efficiency, the structure of the converter in accordance with the invention will now be described with reference to FIGS. 3 to 5.

Figure 3:
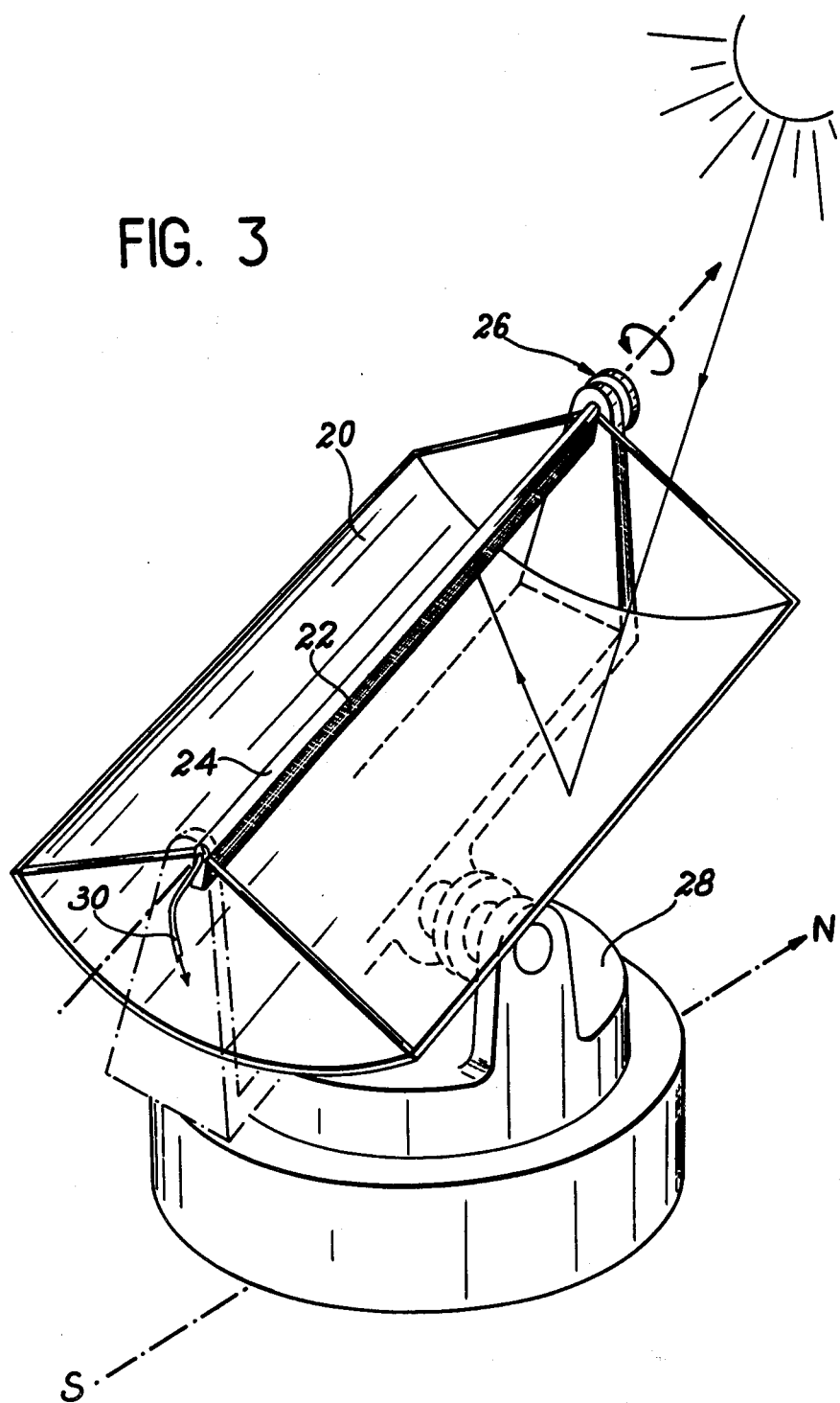
FIG. 3 is a diagrammatic illustration of the structure of the solar energy converter in accordance with the invention.

FIG. 3 shows the diagrammatic structure of a converter in accordance with the present invention. A converter of this type comprises a reflector 20 designed especially in the shape of a parabolic cylinder, an optical converter 22 disposed at the focus of said reflector and a multijunction diode rod 24. The complete assembly is held in position by means of a rotatable supporting frame 26 which rests on a rotatable base 28. These means are capable of directing the reflector 20 towards the sun and following its daily and seasonal motion. The diode rod 24 and consequently the focal line of the reflector 20 are preferably oriented along the earth's axis. Connecting cables 30 for electric current and heat-transporting fluid complete the assembly.

Figure 4:
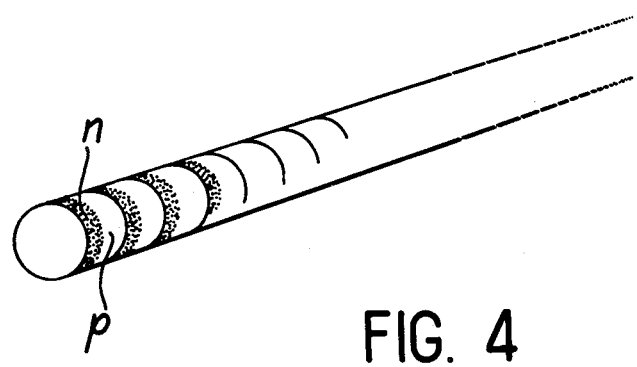
FIG. 4 is a diagrammatic illustration of the structure of the filamentary multijunction diode.

FIG. 4 shows diagrammatically the structure of the filamentary multijunction diode which is preferably employed in accordance with the invention. The rod is constituted by a stack of pn-type junctions fabricated from suitably doped silicon with metallizations located between adjacent unit cells of the stack. The cross-section of a rod of this type can be of any shape and especially circular, the rod diameter being such as to ensure uniform illumination. If reference is made to the table given above, it will be apparent that illumination of satisfactory homogeneity can be obtained in the case of diameters of the order of a few millimeters if the wavelength of the incident radiation is centered at approximately $1.06\mu$. This diameter could clearly be different if the radiation employed were located outside the $1.06\mu$ wavelength zone. At all events said diameter is adapted to the spectrum of the radiation which is re-emitted by the optical converter.

Figure 5:
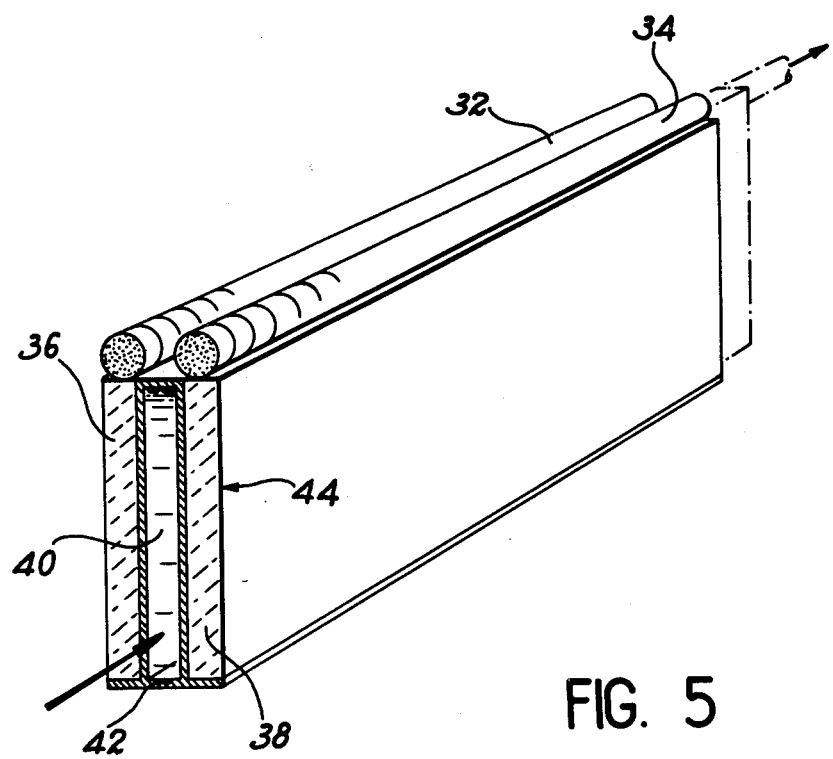
FIG. 5 illustrates a particular embodiment consisting of two diodes and two converters with circulation of heat-transporting fluid between the two converters.

FIG. 5 shows a particular embodiment of the converter in accordance with the invention in which use is made of two diode rods 32 and 34 associated with two optical frequency converters 36 and 38 respectively. These converters are advantageously of neodymium-doped glass.

The advantage of this embodiment lies in the fact that a passage 40 is formed between the two converters 36 and 38. A heat-transporting fluid such as water, for example, can be circulated within said passage in order to remove the heat dissipated within the converters 36 and 38. This arrangement makes it unnecessary to choose a heat-transporting fluid which does not absorb incident radiation. The bottom face 42 can be constituted by a metallic reflector and the outer faces 44 can be coated with a reflecting film having a thickness of $1.06\mu$ in order to constitute a light guide for radiation having a wavelength of $1.06\mu$.

Figure 6:
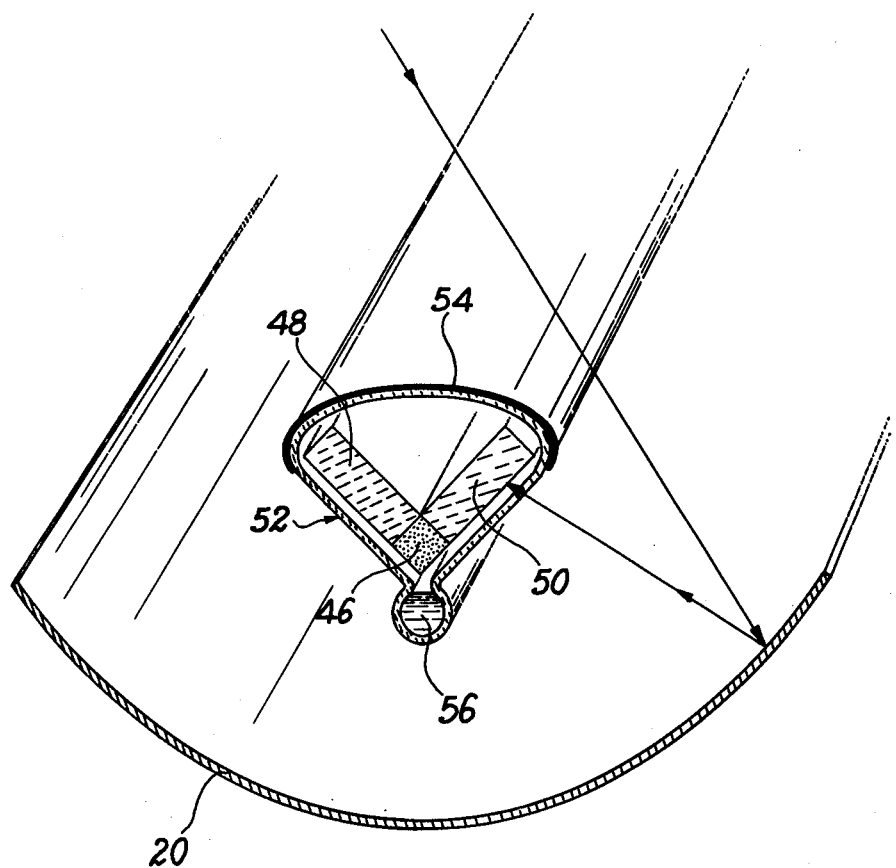
FIG. 6 illustrates a particular embodiment in which the diode and the converter are cooled by vaporization of freon.

FIG. 6 illustrates a particular embodiment of the invention in which a multijunction diode 46 is illuminated by two converters 48 and 50 placed within a glass tube 52 having a special configuration and covered with a metal coating 54. The complete assembly is cooled by Freon-113 which is introduced in the liquid state through the duct 56, then evaporates and maintains a temperature of 50° C. The freon in the gaseous state then cools the converters 48 and 50. The freon can be employed either as a heat-transfer fluid or for the purpose of supplying a gas engine.

In the foregoing description, the focusing structure is a mirror. It would not constitute any departure from the scope of the invention, however, if the mirror were replaced by a cylindrical lens and especially an echelon lens of the Fresnel type. The echelon lenses can be placed either externally, in which case a flat surface is provided within the interior and directed towards the rod or internally, in which case the flat surface is directed towards the sun.

What we claim is:

1. A solar radiation energy to electrical energy apparatus comprising,
    (a) means for focusing solar radiation to a linear form,
    (b) an optical frequency converter plate of transparent material for optical conversion of solar radiation to infrared radiation, said plate positioned adjacent the said focusing means and receiving radiation therefrom, the said frequency converter plate performing the additional function of guiding solar radiation incident thereon to one longitudinal edge of said plate, said one longitudinal edge being parallel to the linear form of the focused radiation, (c) a multijunction, semiconducting rod comprising a plurality of photovoltaic diodes, the junction planes of which are at right angles to the axis of the rod, said rod being positioned along said one of the longitudinal edges of said converter plate, said diodes being illuminated by solar radiation in a direction substantially parallel to the junctions by the solar radiation which has passed through the converter plate and has been guided to said one longitudinal edge of the converter plate.

2. The apparatus of claim 1 including a second, similar converter plate and associated rod, the second converter plate and rod related in the same manner as the converter plate and rod of claim 1, said second converter plate also receiving light from the focusing means, the two converter plates being positioned parallel to each other, and a fluid passageway between the two said plates, the passageway adapted to transport a heat-transporting fluid for removing heat from the two converter plates.

3. The apparatus of claim 1 including a second, similar converter plate, the second plate positioned so that its plane is at an angle to the plane of the first recited plate, the second converter plate having a longitudinal edge thereof positioned adjacent and parallel to said rod, the second converter plate also receiving radiation from the focusing means and also guiding radiation to said diode rod.

4. The apparatus of claim 3 including a transparent tube surrounding the first and second converter plates and the rod, and a heat-transfer liquid within and partially filling the said transparent tube.

* * * * *